US012592533B2

(12) United States Patent　　　　(10) Patent No.:　　US 12,592,533 B2
Matsunaga　　　　　　　　　　　　(45) Date of Patent:　　　Mar. 31, 2026

(54) TERMINAL FIXING METHOD

(71) Applicant: Yazaki Corporation, Tokyo (JP)

(72) Inventor: Yuta Matsunaga, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 1074 days.

(21) Appl. No.: 17/541,005

(22) Filed: Dec. 2, 2021

(65) Prior Publication Data

US 2022/0181832 A1　　Jun. 9, 2022

(30) Foreign Application Priority Data

Dec. 4, 2020　(JP) ................................. 2020-201601

(51) Int. Cl.
| *H01R 43/02* | (2006.01) |
| *B23K 1/00* | (2006.01) |
| *B23K 1/005* | (2006.01) |
| *B23K 26/00* | (2014.01) |
| *B23K 26/067* | (2006.01) |
| *B23K 101/42* | (2006.01) |
(Continued)

(52) U.S. Cl.
CPC ....... *H01R 43/0221* (2013.01); *B23K 1/0016* (2013.01); *B23K 1/0056* (2013.01); *B23K 26/009* (2013.01); *B23K 26/067* (2013.01); *H01R 43/0249* (2013.01); *H01R 43/0256* (2013.01); *B23K 2101/42* (2018.08); *H01R 12/67* (2013.01); *H05K 1/118* (2013.01); *H05K 5/0069* (2013.01); *H05K 2201/094* (2013.01); *H05K 2201/09409* (2013.01)

(58) Field of Classification Search
CPC ........................... B23K 1/0056; B23K 26/067; H01R 43/0249; H01R 43/0256; H05K 2201/094; H05K 2201/09409; H05K 1/118; H05K 2201/09781; H05K 3/3494; G01R 3/00; G01R 1/07314
USPC ...................................... 219/121.64; 324/754
See application file for complete search history.

(56) References Cited

U.S. PATENT DOCUMENTS

| 3,586,813 A | * | 6/1971 | Cruickshank | ........ | B23K 1/0056 |
| | | | | | 392/419 |
| 5,029,243 A | | 7/1991 | Dammann et al. | | |
(Continued)

FOREIGN PATENT DOCUMENTS

| CN | 106716100 B | 5/2019 |
| JP | 62-104194 A | 5/1987 |
(Continued)

*Primary Examiner* — Ibrahime A Abraham
*Assistant Examiner* — Daniel Ward Hatten
(74) *Attorney, Agent, or Firm* — Sughrue Mion, PLLC

(57)　　　　　　　　ABSTRACT

A terminal fixing method, for fixing one or more terminals to a plurality of lands provided on a substrate by laser welding, includes: constructing the plurality of lands by one or more terminal installation lands on which the terminals are installed and one or more dummy lands each larger than each of the terminal installation lands; irradiating each of divided laser beams emitted from a laser oscillator toward a corresponding land of two or more lands in the plurality of lands by the laser welding; and constructing the two or more lands by two or more terminal installation lands in the terminal installation lands, or one or more terminal installation lands in the terminal installation lands and the one or more dummy lands.

7 Claims, 5 Drawing Sheets

(51) Int. Cl.
    *H01R 12/67*        (2011.01)
    *H05K 1/11*        (2006.01)
    *H05K 5/00*        (2006.01)

(56)          References Cited

U.S. PATENT DOCUMENTS

| | | | | |
|---|---|---|---|---|
| 5,495,089 | A * | 2/1996 | Freedman | H05K 3/3494 |
| | | | | 219/121.64 |
| 8,674,261 | B2 * | 3/2014 | No | H10F 71/1375 |
| | | | | 219/121.13 |
| 9,888,583 | B2 * | 2/2018 | Inamori | H05K 3/363 |
| 2003/0150644 | A1 * | 8/2003 | Takada | H05K 3/423 |
| | | | | 174/262 |
| 2007/0199926 | A1 | 8/2007 | Watanabe et al. | |
| 2009/0015276 | A1 | 1/2009 | Yokouchi et al. | |
| 2009/0191730 | A1 * | 7/2009 | Ito | H05K 1/116 |
| | | | | 439/83 |
| 2015/0126078 | A1 | 5/2015 | Kawamura et al. | |
| 2018/0366382 | A1 * | 12/2018 | Yokozawa | H05K 1/05 |

FOREIGN PATENT DOCUMENTS

| | | | |
|---|---|---|---|
| JP | 02-117791 | A | 5/1990 |
| JP | H0521515 | A * | 1/1993 |
| JP | 10-335806 | A | 12/1998 |
| JP | 2003-69163 | A | 3/2003 |
| JP | 2005-50603 | A | 2/2005 |
| JP | 2009-019975 | A | 1/2009 |
| KR | 10-1582587 | B1 | 1/2016 |

* cited by examiner

TERMINAL FIXING METHOD

CROSS-REFERENCE TO RELATED APPLICATIONS

The present application is based on, and claims priority from Japanese Patent Application No. 2020-201601, filed on Dec. 4, 2020, the entire contents of which are incorporated herein by reference.

TECHNICAL FIELD

The disclosure relates to a terminal fixing method.

BACKGROUND

In order to detect voltage of a battery, it is necessary to join a voltage detection wiring member (FPC: Flexible Printed Circuits) to a connector. Therefore, there is known a terminal-connected FPC in which lands are set in the FPC and connector terminals are projected from the lands.

In the terminal-connected FPC, the FPC is joined to the connector by using the connector terminals. In the terminal-connected FPC, the connector terminals (connector terminal pins) are joined to the lands of the FPC by laser soldering (laser welding). That is, the solder is temporarily melted by the laser beam, and then the solder is solidified to fix the connector terminals to the lands of the FPC.

Here, in order to improve the productivity of the terminal-connected FPC, the laser irradiation method by the laser soldering may be changed from the single method to the prism method.

That is, the two connector terminals are fixed to the lands of the FPC by simultaneously irradiating the two laser beams emitted from one laser oscillator and divided into two by the prism toward the two lands. Patent Document 1 (JP 2009-019975 A) is exemplified as a document related to the conventional technology.

SUMMARY

By the way, in the case where the prism method is employed, if the pin arrangement of the connector terminals is an odd number, a situation occurs in which a laser beam is irradiated to a portion where a connector terminal is not present. As a result, the FPC is burned down and the appearance of the insulation (such as measling) is defective.

That is, when the number of lands adjacent to each other is an odd number, two laser beams are applied to each of the plurality of lands and the connector terminal, so that the last land and one connector terminal fixed to the land remain.

When one laser beam out of the two laser beams is irradiated toward the remaining one land, the other laser beam out of the two laser beams is irradiated to the FPC, and the part of the FPC irradiated with the other laser beam is burnt. This problem also occurs when the terminals are installed on a substrate other than the FPC.

An object or the present application is to provide a terminal fixing method for fixing a terminal to each of a plurality of lands of a substrate by laser welding, which prevents a defect from being generated in the substrate by a laser beam while improving productivity.

A terminal fixing method according to an embodiment is a terminal fixing method for fixing one or more terminals to a plurality of lands provided on a substrate by laser welding, and includes: constructing the plurality of lands by one or more terminal installation lands on which the terminals are installed and one or more dummy lands each larger than each of the terminal installation lands; and irradiating each of divided laser beams emitted from a laser oscillator toward a corresponding land of two or more lands in the plurality of lands so as executing the laser welding, wherein the two or more lands are constructed by two or more terminal installation lands in the terminal installation lands, or one or more terminal installation lands in the terminal installation lands and the one or more dummy lands.

According to the embodiment, there is provided a terminal fixing method for fixing a terminal to each of a plurality of lands of a substrate by laser welding, which has the effect of preventing the substrate from being damaged by laser light while improving productivity.

DETAILED DESCRIPTION

Figure 1:
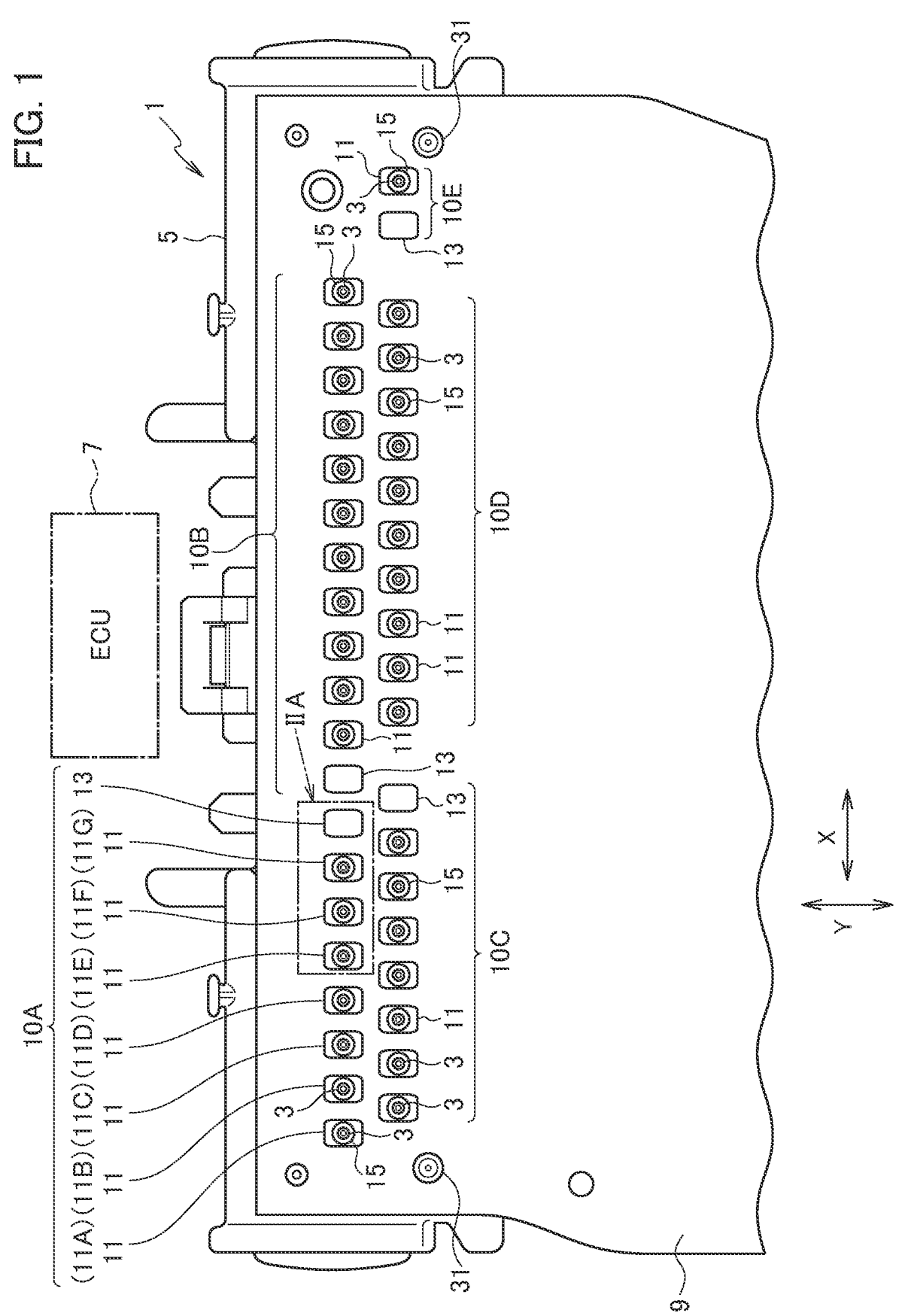
FIG. 1 is a plan view (viewed in the Z direction) illustrating a state in which a terminal-connected FPC manufactured using a terminal fixing method according to an embodiment is installed in a connector.

A terminal-connected substrate (e.g., a terminal-connected FPC) 1 according to an embodiment is used, for example, for detecting voltage of a battery mounted on a vehicle. As illustrated in FIG. 1, the terminal-connected FPC 1 is connected to a connector 5 by using terminals (connector terminals) 3 provided on the terminal-connected FPC 1. The connector 5 is connected to an ECU (Electronic Control Unit) 7.

The terminal-connected substrate 1 includes a substrate (e.g., FPC) 9, a plurality of lands, and a plurality of terminals 3. The plurality of lands are constituted of terminal installation lands 11 and dummy lands 13. The FPC 9 includes a plate-like substrate body portion made of an insulating synthetic resin or the like, and a circuit portion (not illustrated) provided on the substrate body portion. Hereinafter, when "FPC" is referred to, the "FPC" refers to the substrate body portion excluding the circuit portion.

Here, for convenience of explanation, a predetermined direction in space is referred to as a X direction, a predetermined direction orthogonal to the X direction is referred to as a Y direction, and a direction orthogonal to the X direction and the Y direction is referred to as a Z direction.

The terminal installation lands 11, the dummy lands 13, and the terminals 3 are made of conductive materials such as metals. The terminal installation lands 11 are appropriately connected to the circuit portion (not illustrated). The dummy lands 13 are separated from the circuit portion (not illustrated).

Each of the terminal installation lands 11 and the dummy lands 13 is formed in a thin film shape and is provided on the surface of the FPC 9 so that the thickness direction coincides with the thickness direction of the FPC 9. The thickness direction of the FPC 9, the thickness direction of the terminal installation lands 11, and the thickness direction of the dummy lands 13 are in the Z direction.

Each of the terminal installation lands 11 is formed, for example, in a rectangular shape when viewed in the Z direction. An odd number of the plurality of terminal installation lands 11 are provided on the FPC 9 so as to be adjacent to each other in the X direction with a fixed interval therebetween. The shapes of the terminal installation lands 11 are identical to each other.

Each of the dummy lands 13 is formed in, for example, a rectangular shape or a deformed rectangular shape when viewed in the Z direction, formed larger than the terminal installation lands 11, and provided with an odd number (e.g., one). One dummy land 13 is provided in the FPC 9 adjacent to the terminal installation land 11.

More specifically, the plurality of terminal installation lands 11 and the one dummy land 13 are provided on the FPC 9 so as to be spaced apart from each other and adjacent to each other in the X direction. The pitch of the plurality of terminal installation lands 11 and the one dummy land 13 in the X direction is constant. Further, the one dummy land 13 is adjacent to, for example, a terminal installation land 11 located at the most end of the plurality of terminal installation lands 11. The total number of the plurality of terminal installation lands 11 and the number of the one dummy land 13 is an even number.

Each of the terminals 3 is fixed to each of the plurality of terminal installation lands 11 by solder (e.g., soft solder) 15. The dummy land 13 is not provided with a terminal.

The lands consisting of the terminal installation lands 11 and the dummy lands 13 are provided as a plurality of groups, for example, as illustrated in FIG. 1. That is, a land group 10A of a group A consisting of eight lands, and a land group 10B of a group B, a land group 10C of a group C, a land group 10D of a group D, and a land group 10E of a group E each consisting of a plurality of even numbered lands constitute a plurality of groups. In any of the land groups 10A to 10E, a plurality of terminal installation lands 11 or one terminal installation land 11, and one dummy land 13 are arranged at a fixed interval in the X direction.

Here, a mode of fixing the terminal 3 (a mode of installation on the FPC 9) will be described in detail.

Figure 2A:
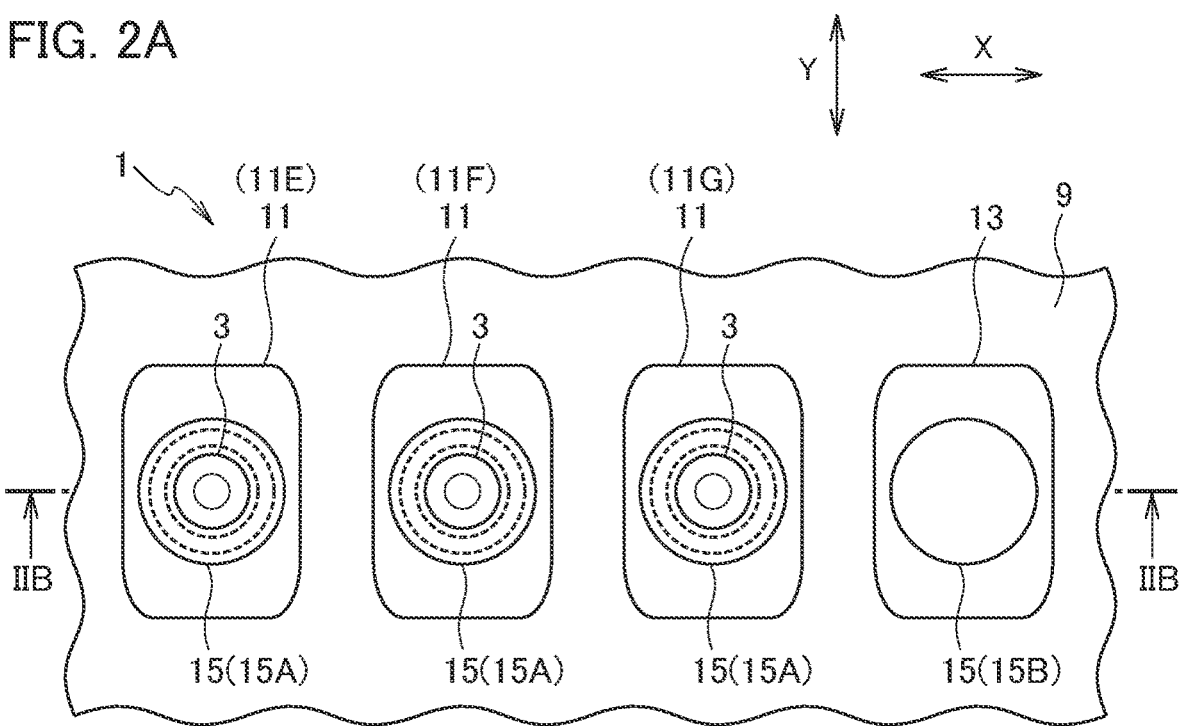
FIG. 2A is an enlarged view of a portion of IIA in FIG. 1.
Figure 2B:
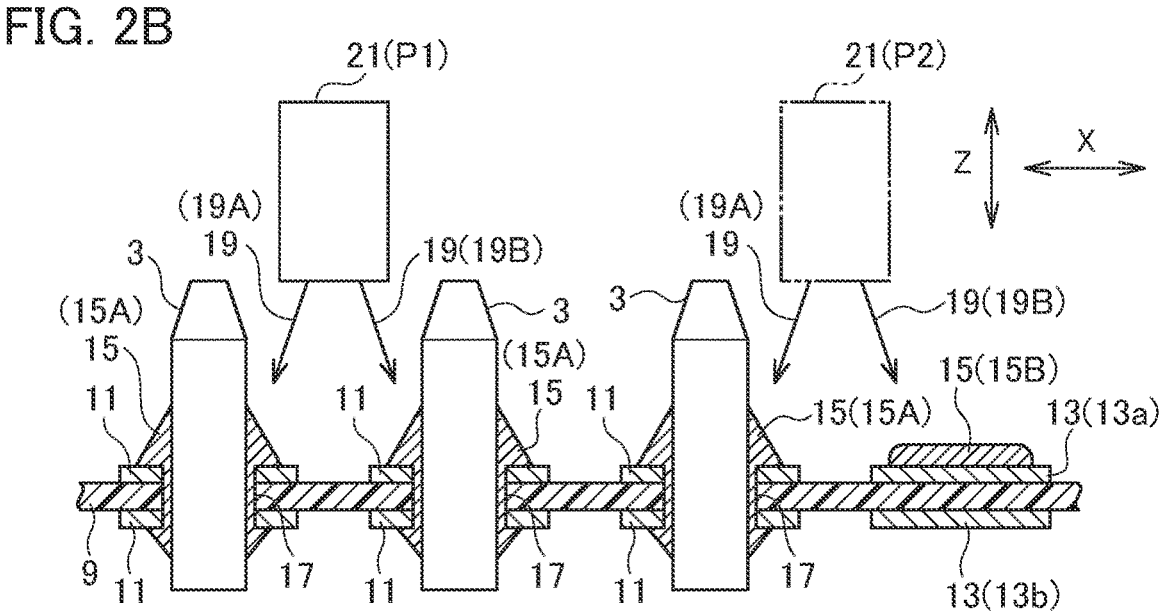
FIG. 2B illustrates a cross-sectional view of IIB-IIB in FIG. 2A.

As illustrated in FIGS. 2A and 2B, each of the terminals 3 is formed in a columnar shape such as a cylindrical shape. The terminal installation lands 11 are provided, for example, on a front surface and a rear surface of the FPC 9. The terminal installation land 11 provided on the front surface of the FPC 9 and the terminal installation land 11 provided on the rear surface of the FPC 9 are formed in the same shape, for example. When viewed in the Z direction, all of the terminal installation lands 11 provided on the front surface of the FPC 9 and all of the terminal installation lands 11 provided on the rear surface of the FPC 9 overlap each other.

The terminal installation lands 11 provided on the front surface of the FPC 9 and the terminal installation lands 11 provided on the rear surface of the FPC 9 may be formed in different shapes and sizes. When viewed in the Z direction, a part of the terminal installation land 11 provided on the front surface of the FPC 9 and a part of the terminal installation land 11 provided on the rear surface of the FPC 9 may overlap each other. Further, when viewed in the Z direction, all of the terminal installation lands 11 provided on the rear surface of the FPC 9 may be housed inside the terminal installation lands 11 provided on the front surface of the FPC 9, or all of the terminal installation lands 11 provided on the front surface of the FPC 9 may be housed inside the terminal installation lands 11 provided on the rear surface of the FPC 9.

The FPC 9 and the terminal installation lands 11 are provided with, for example, through holes 17 each formed in a cylindrical shape. The inner diameter of the through hole 17 is slightly larger than the outer diameter of the terminal 3. The central axis of the through hole 17 and the central axis of the terminal installation land 11 extend in the Z direction and are substantially coincident with each other. The terminal 3 passes through the through hole 17.

The front side part of the solder 15 is provided for fixing the terminal 3 to the terminal installation land 11 of the FPC 9. The front side portion of the solder 15 is in contact with the surface of the terminal installation land 11 provided on the front surface of the FPC 9 and the portion of the terminal 3 projecting from the surface of the terminal installation land 11.

The rear side portion of the solder 15 is in contact with the surface of the terminal installation land 11 provided on the rear surface of the FPC 9 and the portion of the terminal 3 protruding from the surface of the terminal installation land 11.

Further, the solder 15 enters a gap between the terminal 3 and the through hole 17. The front side portion of the solder 15 and the rear side portion of the solder 15 are connected to each other by such an entered part of the solder 15.

The dummy lands 13 are also provided, for example, on the front surface and the rear surface of the FPC 9. For example, the dummy lands 13 provided on the front surface of the FPC 9 and the dummy lands 13 provided on the rear surface of the FPC 9 are formed in the same shape. When viewed in the Z direction, all of the dummy lands 13 provided on the front surface of the FPC 9 and all of the dummy lands 13 provided on the rear surface of the FPC 9 overlap each other.

Figure 3A:
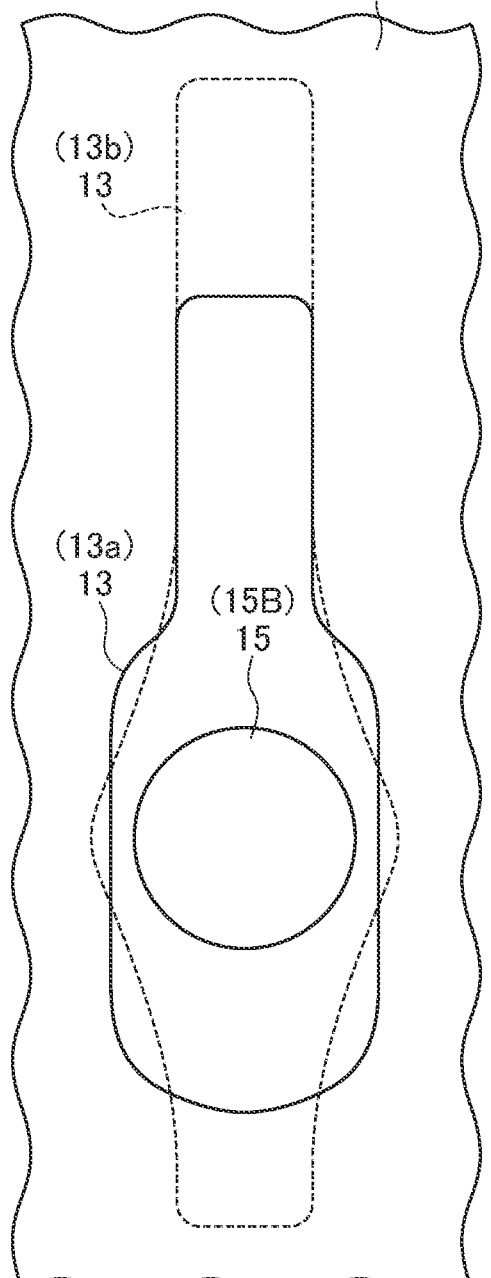
FIG. 3A is a plan view of a dummy land as viewed from a front side.
Figure 3B:
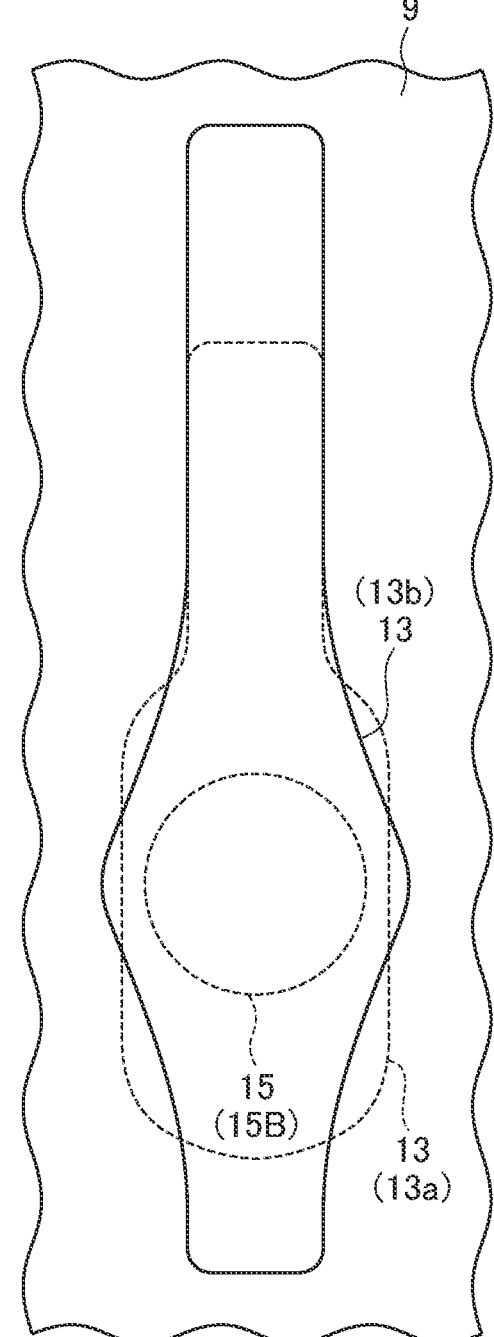
FIG. 3B is a plan view of the dummy land as viewed from a rear side.
Figure 3B:
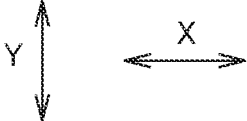

As illustrated in FIGS. 3A and 3B, the dummy lands 13 provided on the front surface of the FPC 9 and the dummy lands 13 provided on the rear surface of the FPC 9 may be formed in different shapes and sizes. When viewed in the Z direction, a part of the dummy land 13 provided on the front surface of the FPC 9 and a part of the dummy land 13 provided on the rear surface of the FPC 9 may overlap each other. Further, when viewed in the Z direction, all of the dummy lands 13 provided on the front surface of the FPC 9 may be housed inside the dummy lands 13 provided on the rear surface of the FPC 9, or all of the dummy lands 13 provided on the rear surface of the FPC 9 may be housed inside the dummy lands 13 provided on the front surface of the FPC 9.

In addition, as illustrated in FIGS. 2A and 2B, solder 15 is also provided on the surface of the dummy land 13 provided on the front surface of the FPC 9.

Here, the fact that the dummy land 13 is larger than the terminal installation land 11 will be described in more detail.

The dummy land 13 is larger than the terminal installation land 11, for example, because the heat capacity of one dummy land 13 is larger than the heat capacity of one terminal installation land 11. When the specific heat of the dummy land 13 and the terminal installation land 11 is equal to each other, the volume of one dummy land 13 is larger than the volume of one terminal installation land 11.

The fact that the specific heat of the dummy land 13 and the terminal installation land 11 is equal to each other will be described in more specifically. It is assumed that the value of the thickness dimension of the terminal installation land 11 is equal to the value of the thickness dimension of the dummy land 13. When viewed in the Z direction, the area of one dummy land 13 is larger than the area of one terminal installation land 11.

Further, the area of the dummy land 13 (13a) provided on the front surface of the FPC 9 is larger than the area of the terminal installation land 11 provided on the front surface of the FPC 9. The area of the dummy land 13 (13b) provided on the rear surface of the FPC 9 is larger than the area of the terminal installation land 11 provided on the rear surface of the FPC 9.

If the heat capacity of the dummy land 13 is larger than the heat capacity of the terminal installation land 11, it is not necessary to maintain the above-mentioned relationship with respect to the area of the terminal installation land 11 on the front and rear surfaces of the FPC 9 and the area of the dummy land 13 on the front and rear surfaces of the FPC 9. However, when the value of the thermal conductivity of the FPC 9 is smaller than the values of the thermal conductivity of the terminal installation land 11 and the dummy land 13, the area of the terminal installation land 11 and the area of the dummy land 13 on the front and rear surfaces of the FPC 9 should be determined in consideration of the relationship of the thermal conductivity.

The terminal installation land 11 is provided with the solder 15 (15A) and the terminal 3, and the dummy land 13 is provided with the solder 15 (15B). The heat capacity of the terminal installation land 11 and the heat capacity of the dummy land 13 can be determined in consideration of the installation of the solder 15 and the terminal 3.

That is, the sum of the heat capacity of the terminal installation land 11, the heat capacity of the solder 15A, and the heat capacity of the terminal 3 may be made approximately equal to the sum of the heat capacity of the dummy land 13 and the heat capacity of the solder 15B. The heat capacity of the solder 15 includes the heat of fusion of the solder 15.

Next, a terminal fixing method will be described. The terminal fixing method may be a method of installing the terminal, a method of connecting the terminal, or a method of fixing the terminal to the substrate. A case where the terminals 3 are fixed to the land group 10A of the group A illustrated in FIG. 1 will be described as an example. When the terminals 3 are fixed to the land group 10B of the group B or the like, the same operation is performed as when the terminals 3 are fixed to the land group 10A of the group A.

The terminal fixing method is a method in which a plurality of terminals 3 are fixed to the land group (lands of the first group) 10A of the group A provided in the FPC 9 to be integrally provided by laser welding.

As described above, the land group 10A of the first group (group A) consists of an odd number of a plurality of terminal installation lands 11 on which the terminals 3 are installed, and an odd number of dummy lands (e.g., one dummy land) 13.

Further, since one terminal 3 is installed on one terminal installation land 11, no terminal is installed on the dummy land 13.

Laser welding is performed by using a laser irradiator 21 for executing a prism method. In laser welding, a split laser beam 19 (19A, 19B) emitted from one laser oscillator of the laser irradiator 21 and divided into a plurality of parts (e.g., two parts) by a prism is used. The split laser beams 19A, 19B have equal intensities and different traveling directions. In the laser irradiator 21, the intensities of the split laser beams 19A, 19B cannot be properly adjusted, and the intensities of the split laser beams 19A, 19B are always equal to each other, for example.

In laser welding, each of the split laser beams 19A, 19B is simultaneously irradiated toward each of a plurality of lands (lands of a second group, e.g., two lands) of a part of the land group 10A of the first group.

In the irradiation with the split laser beams 19A, 19B, the lands of the second group consist of only of the terminal installation lands (e.g., two terminal installation lands) 11. Alternatively, when the split laser beams 19A, 19B are irradiated, lands of the second group is composed of terminal installation lands (e.g., one terminal installation land) 11 and dummy lands (e.g., one dummy land) 13.

In a state before the laser welding, the terminal 3 is appropriately inserted into the through-hole 17 provided at the terminal installation land 11. In the state before laser welding, solder (e.g., thread solder) before melting is supplied to the terminal installation land 11 and the terminal 3 by a solder supply device (not illustrated). In the state before laser welding, solder before melting (e.g., thread solder) is similarly supplied to the dummy land 13.

The supplied solder 15 is temporarily melted by irradiation of split laser beams 19A, 19B, and as illustrated in FIG. 2B, the terminal 3 is fixed to the terminal installation land 11 by the solder 15A, and the solder 15B is installed on the dummy land 13.

Since only the solder 15 is melted by the split laser beams 19A, 19B, the term "laser welding" may not be applied when welding is used in a narrow sense, but it is considered that the term "laser welding" can be used when welding is used in a broad sense even though only the solder 15 is melted.

The laser welding is repeated a plurality of times while appropriately moving and positioning the laser irradiator 21 with respect to the FPC 9 or the like, so that divided laser beams 19A, 19B are irradiated one time at a time toward all of the plurality of lands 11, 13.

It will be explained further with an example. As illustrated in FIGS. 2A and 2B, the split laser beams 19A, 19B are formed into two beams, and as illustrated in FIG. 1, the land group 10A is provided with seven terminal installation lands 11 and one dummy land 13.

In the first laser welding, each of the two split laser beams 19A, 19B is simultaneously irradiated toward the first land 11A for terminal installation and the second land 11B for terminal installation adjacent to each other.

In the second laser welding, each of the two split laser beams 19A, 19B is simultaneously irradiated toward the third terminal installation land 11C and the fourth terminal installation land 11D adjacent to each other.

In the third laser welding, each of the two split laser beams 19A, 19B is simultaneously irradiated toward the fifth terminal installation land 11E and the sixth terminal installation land 11F adjacent to each other.

In the fourth laser welding, each of the two split laser beams 19A, 19B is simultaneously irradiated toward the seventh terminal installation land 11G and one dummy land 13 adjacent to each other.

The third laser welding is performed by the laser irradiator 21 at the position indicated by reference numeral P1 in FIG. 2B. The fourth laser welding is performed by the laser irradiator 21 at the position indicated by reference numeral P2 in FIG. 2B.

As described above, the dummy land 13 consists of a front surface dummy land 13a provided on the front surface as one surface of the thickness direction of the FPC 9 and a rear surface dummy land 13b provided on the rear surface as other surface of the thickness direction of the FPC 9.

The area of the front dummy land 13a and the area of the rear dummy land 13b are different from each other. For example, as illustrated in FIGS. 3A and 3B, the area of the rear dummy land 13b is larger than the area of the front dummy land 13a.

Each of the shape of the front dummy land 13a and the shape of the rear dummy land 13b illustrated in FIGS. 3A and 3B includes a wide portion (a portion having a large value in the X direction) and a narrow portion (a portion having a small value in the X direction), and is elongated in the Y direction. This is because the circuit portion (not illustrated) of the FPC 9 is avoided. The dummy land 13 may have a shape other than those illustrated in FIGS. 3A and 3B.

Figures 5A, 5B:
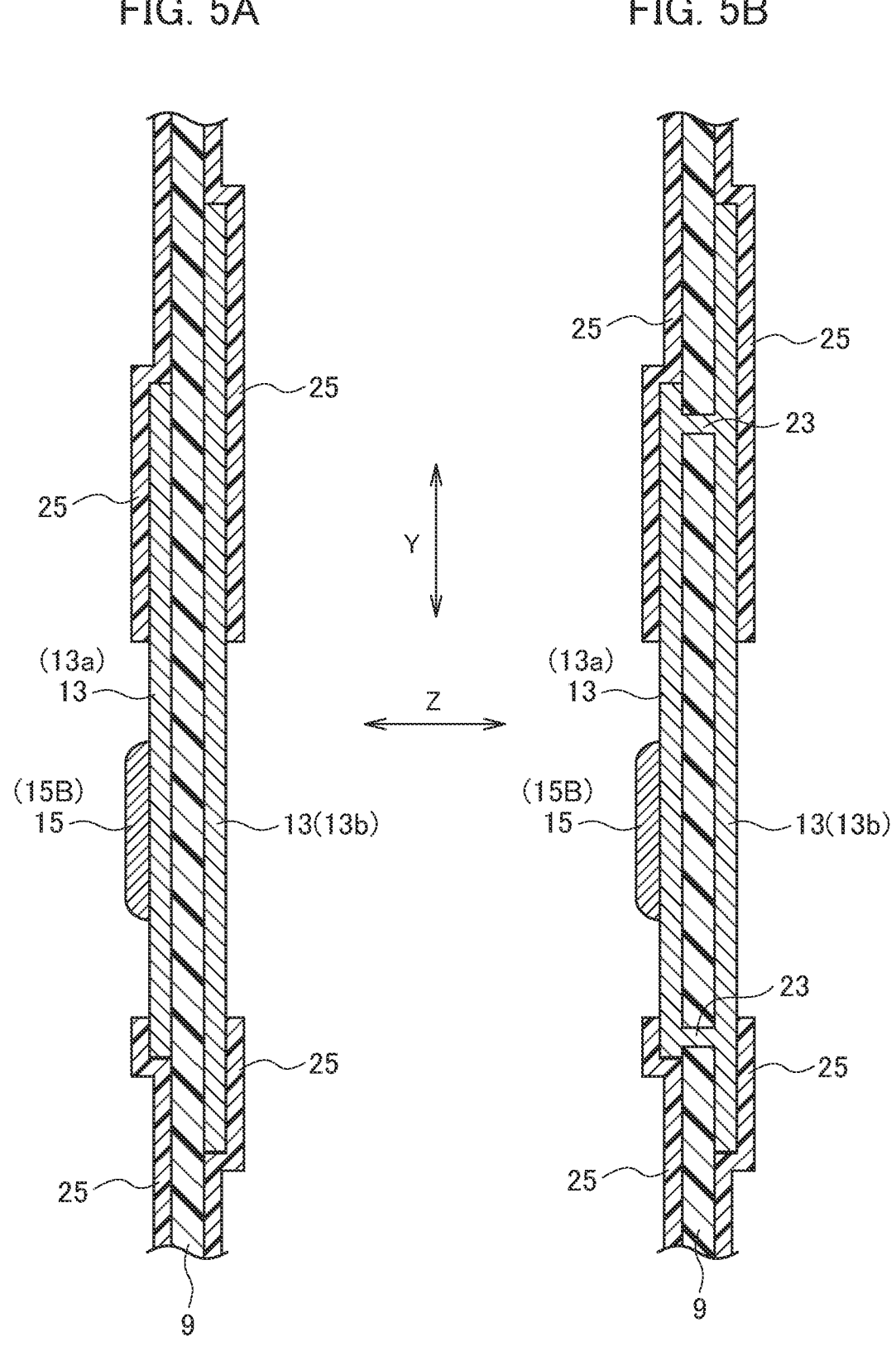
FIG. 5A illustrates a cross-sectional view of VA-VA in FIG. 4.
FIG. 5B is a view illustrating a structure in which a through hole is provided in FIG. 5A.

Further, although the front dummy land 13a and the rear dummy land 13b are disconnected by the FPC 9 between them as illustrated in FIG. 5A, a connecting portion (through hole) 23 may be provided as illustrated in FIG. 5B. That is, the front dummy land 13a and the rear dummy land 13b may be connected to each other by the connecting portion 23 penetrating the FPC 9. The connecting portion 23 is also made of a conductive material such as metal similarly as the lands.

In the laser welding, as described above, the solder 15 is also arranged on the dummy land 13, and the divided laser beam 19B is irradiated toward the dummy land 13, and the solder 15 is temporarily melted and fixed to the dummy land 13.

Figure 4:
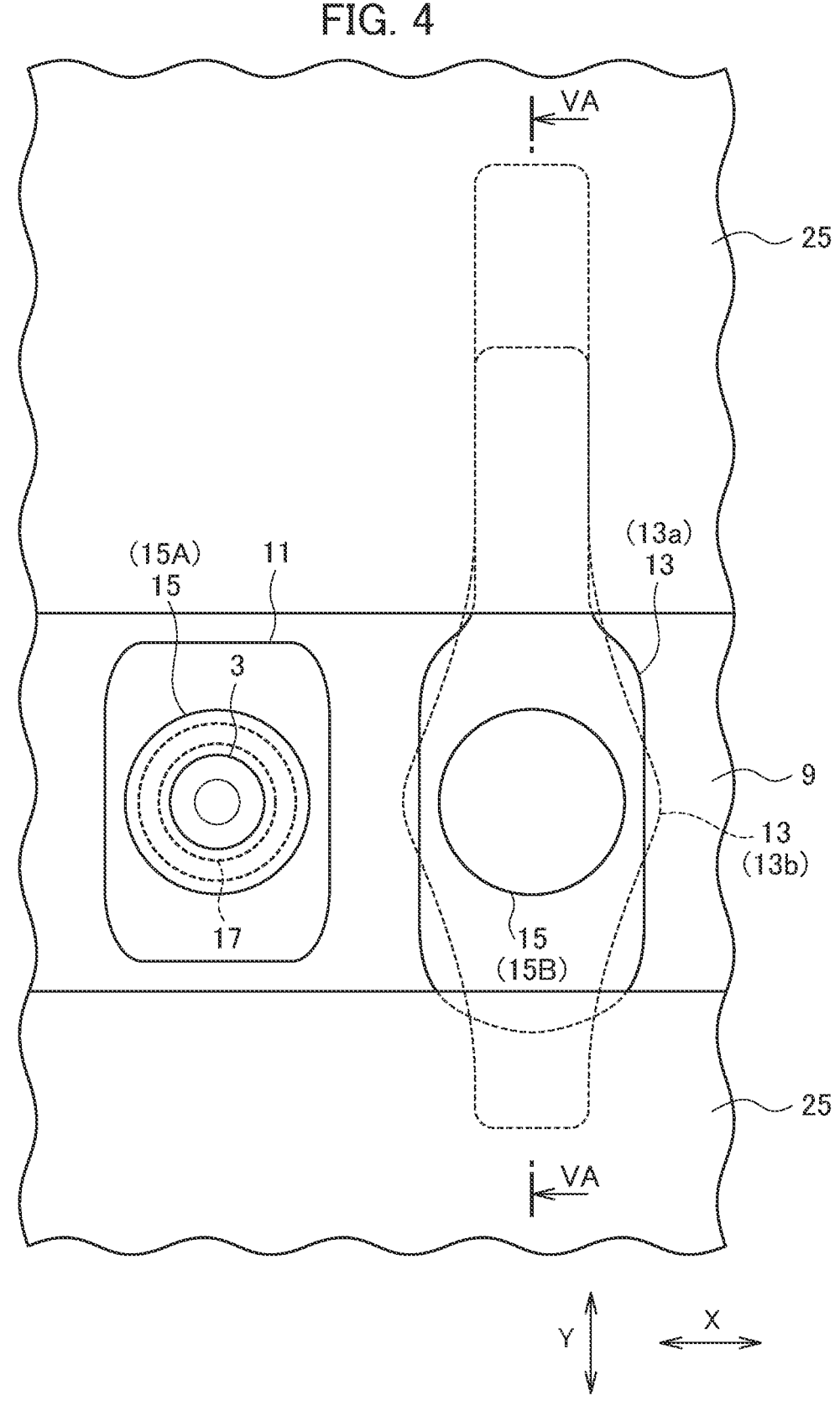
FIG. 4 is a plan view of a terminal installation land and the dummy land provided with a cover lay.

As illustrated in FIGS. 4, 5A, and 5B, in the terminal-connected FPC 1, at least a part of the dummy land 13 may be covered with a cover lay 25 provided integrally with the FPC 9. The cover lay 25 is formed in a plate shape and has a thickness direction in the Z direction. The cover lay 25 covers both ends of the dummy land 13 in the longitudinal direction (Y direction). In other words, both ends of the dummy land 13 in the longitudinal direction are interposed between the FPC 9 and the cover lay 25.

In the terminal fixing method according to the embodiment, the plurality of lands are composed of odd number of terminal installation lands 11 and one dummy land 13. In the laser welding, each of the two split laser beams 19A, 19B is irradiated toward each of the two lands 11 (11, 13). In the terminal fixing method according to the embodiment, the two lands 11 (11, 13) are composed of two terminal installation lands 11, or one terminal installation land 11 and one dummy land 13.

Thus, when the terminal 3 is fixed to each of the plurality of lands 11 of the FPC 9 by repeating laser welding using the two split laser beams 19A, 19B a plurality of times, productivity can be improved. In laser welding using the two split laser beams 19A, 19B, the occurrence of a failure in the FPC 9 by the laser beam 19 can be prevented. That is, since the total number of the terminal installation lands 11 and the dummy lands 13 is an even number, the two split laser beams 19A, 19B are not irradiated to the part of the FPC 9 where the lands are not provided. Then, it is prevented that a failure such as burning of a part of the FPC 9 irradiated with the split laser beams 19A, 19B occurs.

The dummy land 13 is larger than the terminal installation land 11. Thus, damage to the FPC 9 is prevented when the divided laser beam 19A is irradiated toward the terminal installation land 11 and the divided laser beam 19B is irradiated toward the dummy land 13.

In a terminal fixing method according to a comparative example, for example, the dummy lands 13 illustrated in FIG. 1 are not provided. Therefore, when the split laser beam 19A is irradiated toward one terminal installation land 11, the split laser beam 19B is irradiated to a portion of the FPC 9 where the land is not provided.

Further, in the terminal fixing method according to the embodiment, since the dummy land 13 is provided on both sides in the thickness direction of the FPC 9, the adjustment range of the heat capacity of the dummy lands 13 can be widened, and the value of the heat capacity of the dummy lands 13 can be easily increased.

Further, in the terminal fixing method according to the embodiment, since the area of the front dummy land 13a and the area of the rear dummy land 13b are different from each other, it is possible to widen the adjustment range of the heat capacity of the dummy land 13 by effectively utilizing the vacant portions of the front and rear surfaces of the FPC 9.

In the terminal fixing method according to the embodiment, the front dummy land 13a and the rear dummy land 13b may be connected to each other by the through hole 23. Thus, heat conduction between the front dummy land 13a and the rear dummy land 13b is made smoother, and the size of the dummy land 13 can be reduced.

Further, in the terminal fixing method according to the embodiment, when the laser welding is performed, solder (solder for the dummy land) is arranged on the dummy land 13, and the divided laser beam is irradiated toward the dummy land 13. Thus, the solder for the dummy land 13 also contributes to increasing the value of the heat capacity, and the size of the dummy land 13 can be reduced.

Further, in the terminal fixing method according to the embodiment, since the terminal is not installed on the dummy land 13, there is a possibility that the dummy land 13 is peeled off from the FPC 9 due to the impact of the solder weight. However, by covering at least a part of the dummy land 13 with the cover lay 25 provided integrally with the FPC 9, the dummy land 13 is suppressed by the cover lay 25. Thus, peeling of the dummy land 13 from FPC 9 can be prevented.

Further, even when the substrate 9 is a flexible printed circuit (FPC) by the terminal fixing method according to the embodiment, the substrate 9 can be prevented from being damaged by the laser beam 19. More specifically, when the substrate 9 is a rigid substrate, the thickness thereof is about 0.3 mm to 1.6 mm. Therefore, even if the dummy land 13 is not provided, the rigid substrate itself is hardly damaged by the irradiation of the laser beam 19, such as by burning.

When the substrate 9 is an FPC, the thickness is about 12 μm to 50 μm. Therefore, if the dummy land 13 is not provided, the FPC 9 itself is highly likely to suffer damage such as burning due to irradiation of the laser beam 19. However, since the dummy land 13 and the like are provided, the heat of the irradiation of the laser beam 19 can be absorbed, and the occurrence of damage such as burning can be avoided.

When irradiating the laser beam 19 toward the terminal installation land 11 and the dummy land 13, positioning of the FPC 9 with respect to the laser irradiator 21 is naturally required. Therefore, as illustrated in FIG. 1, the FPC 9 is positioned with respect to the connector 5 by positioning pins 31. The laser irradiator 21 is appropriately moved and positioned with respect to the connector 5 which is hardly elastic and can be regarded as almost rigid, and the irradiation of the laser beam 19 is directed to the terminal installation land 11 and the dummy land 13. Although the FPC 9 is flexible, it hardly deforms in the X direction and the Y direction illustrated in FIG. 1, and can be regarded as a substantially rigid body for the forces in the X direction and the Y direction.

Although the embodiment has been described above, the embodiment is not limited thereto, and various modifications can be made within the scope of the gist of the embodiment. For example, in the above description, the laser beam is divided into two, but the laser beam may be divided into N pieces, where "N" is any natural number equal to or greater than 3. In this case, for example, the number of lands of the land group 10A is a multiple of "N".

What is claimed is:

1. A terminal fixing method for fixing one or more terminals to a plurality of lands provided on a substrate by laser welding, comprising:

constructing the plurality of lands by one or more terminal installation lands on which the terminals are installed and one or more dummy lands on which no terminals are installed each larger than each of the terminal installation lands; and irradiating divided laser beams emitted from a laser oscillator toward two or more lands the plurality of lands so as to execute the laser welding, wherein the two or more lands include two or more terminal installation lands, or one or more terminal installation lands and the one or more dummy lands, each of the dummy lands comprises: a front surface dummy land provided on one surface in a thickness direction of the substrate and on which no terminals are installed; and a rear surface dummy land provided on other surface in the thickness direction of the substrate and on which no terminals are installed, and the front surface dummy land and the rear surface dummy land are mutually connected by a connection part penetrating the substrate.

2. The terminal fixing method of claim 1, wherein an area of the front surface dummy land and an area of the rear surface dummy land are different from each other.

3. The terminal fixing method of claim 1, wherein in the laser welding, a solder is arranged on each of the one or more dummy lands, and the laser beams are irradiated toward the one or more dummy lands.

4. The terminal fixing method of claim 1, wherein at least a part of a dummy land in the one or more dummy lands is covered with a cover lay provided on the substrate.

5. The terminal fixing method of claim 1, wherein the substrate is a flexible printed circuit.

6. The terminal fixing method of claim 1, wherein a heat capacity of the one or more dummy lands is greater than a heat capacity of the one or more terminal installation lands.

7. The terminal fixing method of claim 1, wherein the irradiating step includes irradiating the divided laser beams emitted from a laser oscillator toward two of the terminal installation lands, and irradiating the divided laser beams toward one of the terminal installation lands and one of the dummy lands.

* * * * *